United States Patent [19]

Patel et al.

[11] Patent Number: 5,198,158
[45] Date of Patent: Mar. 30, 1993

[54] METHOD OF MANUFACTURING FREE STANDING PEROVSKITE LEAD SCANDIUM TANTALATE FILM

[75] Inventors: Anil Patel, Leicester; Roger W. Whatmore, Milton Keynes, both of England

[73] Assignee: GEC-Marconi Limited, England

[21] Appl. No.: 794,443

[22] Filed: Nov. 19, 1991

[30] Foreign Application Priority Data

Nov. 23, 1990 [GB] United Kingdom ............... 9025547

[51] Int. Cl.⁵ .................... B29C 41/00; B29C 33/40; B29C 33/76
[52] U.S. Cl. ............................... 264/22; 204/192.15; 204/192.22; 264/81; 264/219; 264/317; 264/338
[58] Field of Search ............... 427/100, 255, 255.1, 427/255.7; 156/656, 655, 667; 264/81, 219, 313, 316, 317, 338, 22, 25; 204/192.1, 192.15, 192.22

[56] References Cited

FOREIGN PATENT DOCUMENTS

| | | |
|---|---|---|
| 0134249 | 3/1985 | European Pat. Off. . |
| 3822599 | 1/1990 | Fed. Rep. of Germany . |
| 64-009415 | 1/1989 | Japan . |
| 2222822 | 3/1990 | United Kingdom . |
| WO9005202 | 5/1990 | World Int. Prop. O. . |

Primary Examiner—Jan H. Silbaugh
Assistant Examiner—Christopher A. Fiorilla
Attorney, Agent, or Firm—Kirschstein, Ottinger, Israel & Schiffmiller

[57] ABSTRACT

A method of manufacturing a free standing perovskite lead scandium tantalate film. A film of lead scandium tantalate is formed on a layer of MgO deposited on a sapphire substrate. The MgO layer is etched by phosphoric acid thereby releasing the lead scandium tantalate film from the substrate.

9 Claims, No Drawings

METHOD OF MANUFACTURING FREE STANDING PEROVSKITE LEAD SCANDIUM TANTALATE FILM

BACKGROUND OF THE INVENTION

The present invention relates to a method of manufacturing free standing lead scandium tantalate thin films.

The fabrications of ceramic derived thermal detectors often requires the production of very thin slices of material. This is traditionally achieved by difficult and time consuming lapping and polishing techniques. In order to develop alternate routes to thin film ceramic, methods exploiting the recently developed metal organic precursors of these ceramics have been extensively utilised. These techniques include the deposition of thin films from metal organic solutions and by metal organic chemical vapour deposition (MOCVD). Both of these methods allow the controlled deposition of ceramic films with thicknesses less than 0.1 μm.

These techniques have been successfully developed for material such as lead titanate and the preferred material $Pb(Sc_{\frac{1}{2}}Ta_{\frac{1}{2}})O_3$, (PST). A full account of the deposition methods has been described in patent Application No: PCT/GB89/00395.

The fabrication of free-standing PST films has been prevented previously due to the unavailability of a suitable substrate material. It has been successfully shown that PST can be readily grown in thin film form on substrates such as sapphire and gadolinium gallium garnet (GGG), as both possess coefficients of expansion very close to that of PST (6.5 ppm/K). However, both of these substrates are inert, in terms of device fabrication as both are difficult to remove.

SUMMARY OF THE INVENTION

An object of the present invention is to provide a method of manufacturing perovskite free standing PST films.

According to the present invention there is provided a method of manufacturing a free standing perovskite lead scandium tantalate film, the method comprising forming a film of a lead scandium tantalate on a layer of magnesium oxide deposited on a sapphire or gadolinium gallium garnet (GGG) substrate and etching said magnesium oxide layer to release said lead scandium tantalate film from the substrate.

In one embodiment a film of MgO 1μm thick is formed by sputtering from a MgO target, onto a sapphire substrate. A film of PST is then formed by depositing layers of $ScTaO_4$, interspaced with layers of PbO. Heating the layers in the presence of $PbZrO_3$ spacer powder at 900° C. for a time dependant upon film thickness gives a film of PST. The PST layer on MgO/sapphire is then submerged in phosphoric acid until the PST layer is released from the substrate, as a free-standing film. The MgO film may alternatively be etched by hydrochloric acid.

DESCRIPTION OF THE PREFERRED EMBODIMENTS

The invention is further illustrated by the following example of forming a lead scandium tantalate film on a layer of MgO deposited on a sapphire substrate.

A $ScTaO_4$ layer is deposited from a solution, starting with scandium (III) acetylacetonate $Sc(acac)_3$ and tantalum ethoxide $Ta(OEt)_5$ as precursors in 2-aethoxyethanol solution. The $ScTaO_4$ layers are formed by first forming $Sc(acac)_3$ solution at 120° C., cooling it to 90° C., adding $Ta(OEt)_5$, complexing at 120° C., cooling and spinning the resulting solution onto a layer of MgO deposited on a sapphire substrate, and drying the $ScTaO_4$ layers at 400°-500° C. Thicker layers may be obtained by repeating the operation. A layer of lead oxide (PbO) is interspaced between the $ScTaO_4$ layers, by spinning onto the $ScTaO_4$ layer a dehydrated solution of lead acetate in 2-methoxyethanol, followed by a drying stage at 400°-500° C. The substrate with these layers is finally fired in a lead-rich environment to form a film of polycrystalline PST.

This thin film deposition process is not restricted to the solution method as it has also been shown that PST can be deposited using MOCVD (metallorganic chemical vapour deposition) using volatile precursors, and laser ablation using a ceramic target.

In a further embodiment the MgO layer is deposited by E-beam evaporation onto a sapphire substrate.

Details of the deposition method referred to are well known in the art and will therefore not be described herein.

We claim:

1. A method of manufacturing a free standing perovskite lead scandium tantalate film, the method comprising forming a film of a perovskite lead scandium tantalate on a layer of magnesium oxide deposited on a sapphire or gadolinium gallium garnet (GGG) substrate and etching said magnesium oxide layer to release said perovskite lead scandium tantalate film from the substrate.

2. A method as claimed in claim 1, in which said MgO layer is deposited by sputtering from a MgO target.

3. A method as claimed in claim 1, in which said MgO layer is deposited by E-beam evaporation.

4. A method as claimed in claim 1, in which said MgO layer is etched by phosphoric acid or hydrochloric acid.

5. A method as claimed in claim 1, in which the thickness of said MgO layer is $\leq 1\mu m$.

6. A method as claimed in claim 1, in which the lead scandium tantalate film is formed by depositing layers of scandium tantalate, interspaced with layers of lead oxide and heating said layers in lead-rich environment to form a polycrystalline lead scandium tantalate film on said MgO layer.

7. A method as claimed in claims 6, wherein said layers of scandium tantalate are formed from a solution of scandium (III) acetylacetonate and tantalum ethoxide as precursors in methoxyethanol solution.

8. A method as claimed in claims 6, in which said layers of lead oxide are formed from a solution of lead acetate in 2-methoxyethanol.

9. A method as claimed in claim 1, in which said film of lead scandium tantalate is formed by metalorganic chemical vapor deposition (MOCVD) technique.

* * * * *